US 6,574,257 B1

(12) United States Patent
Thronton et al.

(10) Patent No.: US 6,574,257 B1
(45) Date of Patent: Jun. 3, 2003

(54) NEAR-FIELD LASER AND DETECTOR APPARATUS AND METHOD

(75) Inventors: Robert L. Thronton, Los Altos, CA (US); Lambertus Hesselink, Atherton, CA (US)

(73) Assignee: Siros Technologies, Inc., San Jose, CA (US)

( * ) Notice: Subject to any disclaimer, the term of this patent is extended or adjusted under 35 U.S.C. 154(b) by 0 days.

(21) Appl. No.: 09/495,638

(22) Filed: Feb. 1, 2000

(51) Int. Cl.$^7$ ................................................. H01S 5/00
(52) U.S. Cl. ............................ 372/46; 372/43; 372/44; 372/45; 372/29.01; 372/29.001; 372/29.02; 372/38; 372/50; 372/96; 369/121; 369/122; 369/44; 369/12; 369/126; 250/306; 250/216
(58) Field of Search ..................... 372/29.01, 29.001, 372/29.02, 38, 50, 43–46, 96; 369/121, 122, 44, 12, 126; 250/306, 216

(56) References Cited

U.S. PATENT DOCUMENTS

| 4,460,977 | A |   | 7/1984  | Shimada et al. | ............ 365/106 |
| 4,860,276 | A |   | 8/1989  | Ukita et al.   | ............ 369/119 |
| 5,084,887 | A | * | 1/1992  | Ohashi         | ............ 372/26  |
| 5,559,773 | A |   | 9/1996  | Kentatsu et al.| ............ 369/44.42|
| 5,590,110 | A |   | 12/1996 | Sato           | ............ 369/100 |
| 5,619,371 | A |   | 4/1997  | Pontius        | ............ 359/368 |
| 5,625,617 | A |   | 4/1997  | Hopkins et al. | ............ 369/121 |
| 5,636,190 | A |   | 6/1997  | Choi           | ............ 369/44.23|
| 5,696,372 | A |   | 12/1997 | Grober et al.  | ............ 250/216 |
| 5,703,491 | A | * | 12/1997 | Nakamura et al.| ............ 324/750 |
| 5,894,467 | A |   | 4/1999  | Wang           | ............ 369/121 |
| 5,917,848 | A |   | 6/1999  | Claisse et al. | ............ 372/96  |
| 5,978,408 | A |   | 11/1999 | Thornton       | ............ 372/96  |
| 6,314,122 | B1| * | 11/2001 | Peale          | ............ 369/121 |
| 6,351,311 | B1| * | 2/2002  | Numai          | ............ 356/461 |

FOREIGN PATENT DOCUMENTS

| JP | 10143895   | 5/1998  | ............ G11B/7/125 |
| JP | 10172166   | 6/1998  | ............ G11B/7/125 |
| JP | 10255302   | 9/1998  | ............ G11B/7/125 |
| JP | 10340468 A | 12/1998 | ............ G11B/7/125 |
| JP | 63306546 A | 12/1998 | ............ G11B/7/135 |
| WO | WO 99/01277| 1/1999  | ............ B32B/3/00  |

OTHER PUBLICATIONS

Modeling of Micro–Aperture Surface Emitting Lasers for Near–Field Optics, Koyama, et al., Oct.–'98.
Proposal of Ultrahigh Density Optical Disk System Using a Vertical Cavity Surface Emitting Laser Array, Kenya Goto, Jan. 19, 1998.
High Bit Rate and Tera Bytes Optical Memory in a Disk System, Kenya Goto, Japan, Spie vol. 3109.

(List continued on next page.)

Primary Examiner—Quyen Leung
Assistant Examiner—Delma R. Flores-Ruiz
(74) Attorney, Agent, or Firm—Sierra Patent Group, Ltd.

(57) ABSTRACT

A near-field laser and detector apparatus and method wherein both writing and reading of optical media can be carried out using the same laser operating in a single mode for both read and write operations. The single operational mode can be utilized with both edge emitting and surface emitting laser configurations, and allows readout via rear facet output power variation or by voltage variation across the laser. A small aperture laser is operated during read and write operations at a bias current which is higher than the threshold currents associated with feedback from high and low reflectivity regions of an optical medium. The bias current and laser structure provide a relatively high, continuous output power from the front emission facet of the laser to facilitate writing, while providing substantial fluctuation or change in output power from the rear emission facet to facilitate readout.

38 Claims, 4 Drawing Sheets

OTHER PUBLICATIONS

Electron Cyclotron Resonance (ECR) Sputtered Antireflection Coatings on Laser Facets for Optical Memory Applications, Kim, et al., Japan, vol. 37, pp. 2201–2202, Apr. '98.

Near–Field Analysis of Micro–Aperture Surface Emitting Laser for High Density Optical Data Storage, Shinada, et al., vol. 6, No. 6, 8–'98.

Near–Field Analysis of Micro–Aperture Surface Emitting Laser for High Density Optical Data Storage, Shinada, et al., Optical Review—vol. 6, No. 6, 8–'99.

High–power Laser Light Source for Near–Field Optics and its Application to High–Density Optical Data Storage, Partovi, et al., vol. 75, No. 11, 7–'99.

Gradient–Index Microlens formed by Ion–Beam Sputtering, Shimada, et al., Applied Optics/vol. 31, No. 25, 9–'92.

Optical Near–Field Aperture Storage Technique (ONFAST) Partovi, et al.

An Optically Accessed Memory using the Lippmann Process for Information Storage, Fleisher, et al., Performed under Government Contract No. AF33–657–11589, Aeronautical Systems Division, 1965.

High–Density Optical Recording using a solid Immersion Lens, Ichimura, et al., vol. 36, No. 19, Jul.–'97.

Optical Heads Based on Coupled–Cavity Laser Diode, Yoshitada, et al., Japan—1916, Spie vol. 2514.

Applications of an Extremely Short Strong–Feedback Configuration of an External–Cavity Laser Diode System Fabricated with GaAs–Based Integration Technology, Ukita, et al., vol. 33, No. 24, 8–'94.

Flying Head Read/Write Characteristics using a Monolithically Integrated Laser Diode/Photodiode at a Wavelength of 1.3 βm, Ukita, et al., Spie vol. 1499, Japan—'91.

Supersmall Flying Optical Head for Phase Change Recording Media, Ukita, et al., Applied Optics/vol. 28, No. 20, Oct.—'89.

Read/Write Performance and Reliability of a Flying Optical Head using a Monolithically Integrated LD–PD, Ukita, et al., vol. 30, No. 26, 9–'91.

Beam Converging Laser Diode by Taper Ridge Waveguide, vol. 24, No. 10, May '88.

Readout Characteristics of Micro–Optical Head Operated in Bi–Stable Mode, Ukita, et al., Japan—'87.

Near–Field Optical Data Storage, Terris, et al., No. 2, Jan.—'96.

Proposal of a Near Field Optical Head using a New Solid Immersion Mirror, Ueyanagi, et al., Japan, 7/'99.

Experiments of Novel Optical Floppy Disk Drive using Phase Change Optical Medium & Quasi–Near Field Optical Head, vol. 3864, 7/'99.

Optical Near–Field Aperture Storage Technique (ONFAST) for High Density, High Performance Data Storage Applications, Afshin Partovi, vol. 3864, Jul. '99.

Optical Near–Field Probe action in Microdisk Laer with 0.12 Resolution, Yamada, et al., vol. 35, No. 3, '99.

Proposal of Optical Near–Field Probe Using Evanescent Field of Microdisk Laser, Sakai, et al., Japan, '97.

* cited by examiner

NEAR-FIELD LASER AND DETECTOR APPARATUS AND METHOD

BACKGROUND OF THE INVENTION

1. Field of the Invention

This invention pertains generally to near-field optical devices and methods for reading and writing on optical media. More particularly, the invention is a single mode laser apparatus and method for near field optical information reading and writing, wherein both reading and writing modes are achieved in a single mode laser, and where laser voltage variation, as well as rear facet power, may be utilized as an output signal.

2. Description of the Background Art

Optical information storage technologies have provided increasing storage densities over the years. Conventional far-field techniques for reading and writing optical media utilize a collimated laser beam which is focused onto the optical medium by an objective lens. For a laser beam of wavelength $\lambda$ and an objective lens with a numerical aperture NA, a read/write spot size of $\lambda/2NA$ is obtained. These techniques have allowed reading and writing of optical media having storage densities in the $Gb/in^2$ range.

Far-field read/write techniques are generally limited by the light wavelength and numerical aperture of the focusing optics used for reading and writing. Increasing the NA to greater than approximately 0.6 results in rapid increases in astigmatisms and beam abberations. Closer positioning of the objective lens and medium can overcome these problems to a certain extent, but results generally in decreased reliability. Presently, commercially available storage systems having output wavelengths of about 650 nm provide storage densities of about 2–3 $Gb/in^2$.

Use of shorter wavelength semiconductor lasers will allow increased storage densities. InGaAlP double heterostructure lasers have provided outputs in the 600 nanometer range. Edge emitting and surface emitting devices based on ZincBlende Group III–V materials such as ZnSe, CdZnSe and MgZnSSe are known which operate with blue-green output. More recently, edge and surface emitting lasers based on AlGaN and AlGaInN have been shown which provide outputs approaching the ultraviolet. These shorter wavelength laser devices, however, tend to have limited output powers, limited operational temperature ranges, and are subject to materials limitations which have so far resulted in poor reliability and relatively rapid deterioration. Further, the far-field diffraction limitations noted above will probably limit increases in storage densities to around a factor of two to four, even if the most promising short wavelength semiconductor lasers become commercially viable.

One approach to increased storage densities has been through the use of a solid immersion lens (SIL) positioned between the objective and the optical medium, which has allowed an increase in NA which is proportional to the refractive index of the SIL material. This technology has resulted in a spot size (diameter) of around 600 nanometers, and storage densities approaching 10 $Gb/in^2$. Refractive index limitation of SIL materials, however, will prevent further increases in storage densities using this technology.

A more promising approach to increased optical storage densities has been through development of other near-field optical data storage techniques, which offer potentially high data storage densities and readout rates. These near-field optical techniques require the use of radiation source apertures and distances on the order of generally less than the wavelength $\lambda$ of the radiation source to allow high storage densities. With aperture-based near-field techniques, storage densities are limited primarily by the light aperture size and distance between the aperture and optical medium. Using currently available semiconductor lasers and near-field techniques, storage densities on the order of around 100 $Gb/in^2$ appear possible.

Small aperture light sources for near-field applications have been obtained through tapered optical fibers with metallized sides, which have provided apertures as small as 200 nanometers. Tapered fiber devices, however, have only been able to provide an output power of around 50 nW for input power into the fiber of 10 mW, with higher input power resulting in catastrophic failure at the light emitting aperture. This low output power severely limits data rates for optical storage using currently available media.

A more attractive near-field technology has involved use of small features associated with the emission facet of semiconductor laser devices, such that a substantial portion of output power is directed through a small area of the emission facet. Surface emitting and edge emitting devices have been made which have an emission facet aperture, of $\lambda/2$ width or smaller, through which one half or more of the total emission can be directed. Edge emitting devices have also been made having tapered slits, normal to the emission facet, which are filled with low refractive index material to define waveguides which sharpen the beam spot from the emission facet.

The known near-field semiconductor laser structures exhibit an number of features, particularly with regard to output power and readback signal. When the internal mode of a semiconductor laser is coupled to the external mode between the reflective surface of the optical medium and the laser output facet, as occurs in near-field operation in reflection, the laser threshold current and laser output intensity will vary according to feedback light reflected back into the laser from the optical medium. During readout, low reflectivity spots on the medium providing less reflective feedback, and high reflectivity regions providing correspondingly more reflective feedback. For a wide area output aperture, it has been previously proposed that these variations be designed such that the laser undergoes transitions above and below laser threshold. However, the resulting changes in laser threshold and output power can limit data rates due to turn-on delays and relaxation oscillations in the laser. Further, during the writing and erasing processes, the reflectivity fluctuations result in unstable, fluctuating output power from the laser front facet, limiting the control of data writing. On the other hand, a substantial change in output power at the laser rear facet facilitates use of rear facet output for readback. Previously available semiconductor lasers for near-field use have been unable to provide stable, front facet output power for effective writing, together with fluctuating rear facet output power for effective readout.

There is accordingly a need for a near-field laser and detector apparatus and method which can operate at high data rate, which provides stable, high output power from a front facet for effective writing, and which provides substantial modulation in output power from a rear facet for effective readout. The present invention satisfies these needs, as well as others, and generally overcomes the deficiencies found in the background art.

SUMMARY OF THE INVENTION

The invention is a near-field laser and detector apparatus and method wherein both writing and reading optical media can be carried out using the same or very similar small-apertured lasers. The reading and writing modes provided by the invention can be accomplished with a single mode laser, without multimode operation. The single operational mode can be utilized with both edge emitting and surface emitting laser configurations, and allows readout via rear facet output power variation or laser voltage variation.

In general terms, the invention comprises a small aperture laser operating with a bias current higher than a threshold current associated with feedback from a high reflectivity portion of an optical medium, and a voltage detection system associated with the p- and n- contacts of the laser. An optical detection system may alternatively be used instead of the voltage detection system.

By way of example, and not necessarily of limitation, the laser comprises an active region positioned between a first conductivity-type clad region and a second conductivity-type clad region. The active region, first conductivity-type clad region and second conductivity-type clad region define generally a laser cavity. A first, front emission facet on the laser includes an aperture thereon, with the aperture having a width which is generally smaller than the output wavelength of the laser. The first emission facet is positioned proximate to an optical medium during operation.

The active region, first conductivity-type clad region and second conductivity-type clad region are structured and configured such that the laser operates with a bias current which is greater than the threshold currents associated with feedback from both high and low reflectivity regions of an optical medium. More preferably, the bias current is such that output power fluctuation from the front facet of the laser is minimal, while output power fluctuation from a rear facet of the laser is substantial.

A first electrical contact is associated with the first conductivity-type clad region, and a second electrical contact is associated with the second conductivity-type clad region. A voltage detection circuit is placed in electrical communication with the first and second electrical contacts via first and second electrical conductors. Voltage fluctuations associated with feedback from the high and low reflectivity portions of the optical medium are detected by the voltage detector circuit.

In a first embodiment, the laser is an edge emitting semiconductor laser wherein the first emission facet is generally normal to the plane defined by the laser active region. A second, back emission facet, which is substantially parallel to the first emission facet, faces away from the optical medium. An optical detector may be included proximate to the second emission facet and positioned to read the optical output from the second emission facet. In a second embodiment, the laser is a vertical cavity surface emitting semiconductor laser.

The laser and detector of the invention are associated with an optical head having an aerodynamic slider which is coupled to a read/write arm via a suspension system. During operation, the optical head preferably is positioned adjacent an optical medium, which may comprise a phase change material such as a GeTeSb alloy, to allow multiple write and erasure events. Preferably, the laser is positioned such that the internal mode of the laser is substantially coupled to the external mode between the reflective surface of the optical medium and the first emission facet.

In one embodiment, during writing the laser is pulsed to locally heat the high reflectivity polycrystalline phase change material above its melting point to create an amorphous melt spot of relatively low reflectivity, which is of comparable size to the aperture area on the first emission face. Readout is obtained by flying the laser over the optical medium and measuring the changes in reflection associated with the low reflectivity amorphous melt spots and higher reflectivity unmelted, polycrystalline regions of the medium.

The laser threshold current and laser output intensity vary generally according to feedback light reflected back into the laser from the optical medium, with the amorphous spots on the medium providing less reflective feedback than the high reflectivity polycrystalline regions. During both writing and readout, the bias current for the laser is maintained at a level higher than the laser threshold current, such that minimal variation in output intensity occurs from the first, front emission facet, while substantial variation in output intensity is achieved from the second, rear emission facet. Readout may be effected by optical detection of output from a rear facet, or by measuring voltage variation associated with the electrical contacts on the laser, which are positioned to monitor voltage modulation associated with output power fluctuation from the rear facet. Operation in this manner allows both reading and writing with the same laser operating in a single mode.

Further advantages of the invention will be brought out in the following portions of the specification, wherein the detailed description is for the purpose of fully disclosing the preferred embodiment of the invention without placing limitations thereon.

BRIEF DESCRIPTION OF THE DRAWINGS

The present invention will be more fully understood by reference to the following drawings, which are for illustrative purposes only.

DETAILED DESCRIPTION OF THE PREFERRED EMBODIMENTS

Referring more specifically to the drawings, for illustrative purposes the present invention is embodied in the apparatus and graphical illustration shown generally in FIG. 1 through FIG. 4. It will be appreciated that the apparatus may vary as to configuration and as to details of the parts without departing from the basic concepts as disclosed herein. The invention is disclosed generally in terms of use with GaAs/InGaP semiconductor lasers operating in reflection at 980 nanometers, and "phase change" optical media based on GeTeSb materials. These particular laser and optical media materials and properties are only exemplary, however, and it should be readily apparent to those skilled in the art that the type of semiconductor laser and optical medium used with the invention may embody a wide variety structures, configurations, and materials, and may be operated for transmissive or reflective detection.

Figure 1:
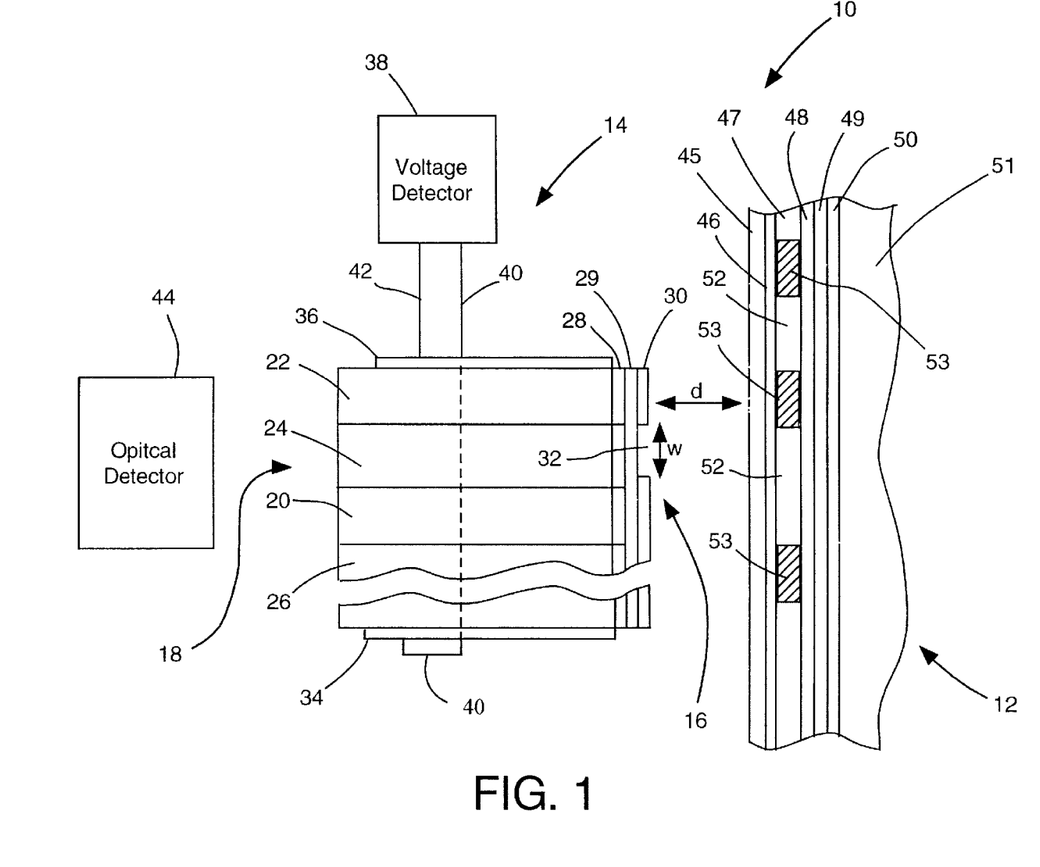
FIG. 1 is a schematic side elevation view, in partial cross-section, of a near-field laser and detector apparatus in accordance with the present invention.

Referring now to FIG. 1, a near-field laser and detector apparatus 10 in accordance with the invention is shown together with an optical medium 12. It should be understood that the relative dimensions and distances of various parts of the apparatus 10 and medium 12 are exaggerated for reasons of clarity, and are not necessarily shown to scale. The apparatus 10 includes a semiconductor laser 14 having a first, front emission facet 16, and a second, rear emission facet 18. Laser 14 also includes a first conductivity type clad layer which is shown as n-type clad layer 20, and a second conductivity-type clad layer shown as p-clad layer 22. An active region 24 is positioned between p-clad layer 22 and n-clad layer 20. Laser 14 may grown on an n-semiconductor substrate 26 by conventional, well-known low-cost, high volume semiconductor IC fabrication methods such as metal organic vapor phase epitaxy (MOVPE), liquid phase epitaxy (LPE) and/or molecular beam epitaxy (MBE) techniques.

Front emission facet 16 preferably includes a first dielectric layer 28 deposited thereon, a second dielectric layer 29 deposited on first dielectric layer 28, and a metal layer 30 deposited on second dielectric layer 29. An aperture 32 in front emission facet 16 is provided such that the width w of aperture 32 is less than the output wavelength $\lambda$ of laser 14. Aperture 32 is formed by conventional anisotropic etching techniques such as focussed ion beam (FIB). Use of a Micrion 9000 FIB system allows formation of aperture sizes of 50 nm by 50 nm, or 2500 $nm^2$.

Metal layer 30 serves to block radiation from emission facet 16 except at aperture 32. Metal layer 30 is preferably highly reflective and comprises a metal such as Au, Ag, Pt or the like. Metal layer 30 may alternatively comprise multiple layers of such metals. Dielectric layers 28, 29 may comprise, for example, $Al_2O_3$, $SiO_2$, $TiO_2$, AlN, MgF, or other dielectric material. Dielectric layers 28, 29 prevent electrical shorting of laser 14 which would otherwise occur if metal layer 30 were deposited directly onto emission facet 16. Dielectric layers 28, 29 also provide for dissipation of heat associated with metal layer 30, and provides a spacer which may be adjusted in optical thickness according to the desired output properties of laser 14. Dielectric layers 28, 29, together with metal layer 30, are preferably designed or selected to control the macroscopic transmittance and reflectance of emission facet 16, in the event that the reflection of the incident beam is not desired. In this regard, layer 29 may be absorbing or reflecting at particular wavelengths, according to the particular use of the invention. Additional dielectric and/or metal layers may be used to control the transmittance and reflectance of emission facet 16.

Figure 2:
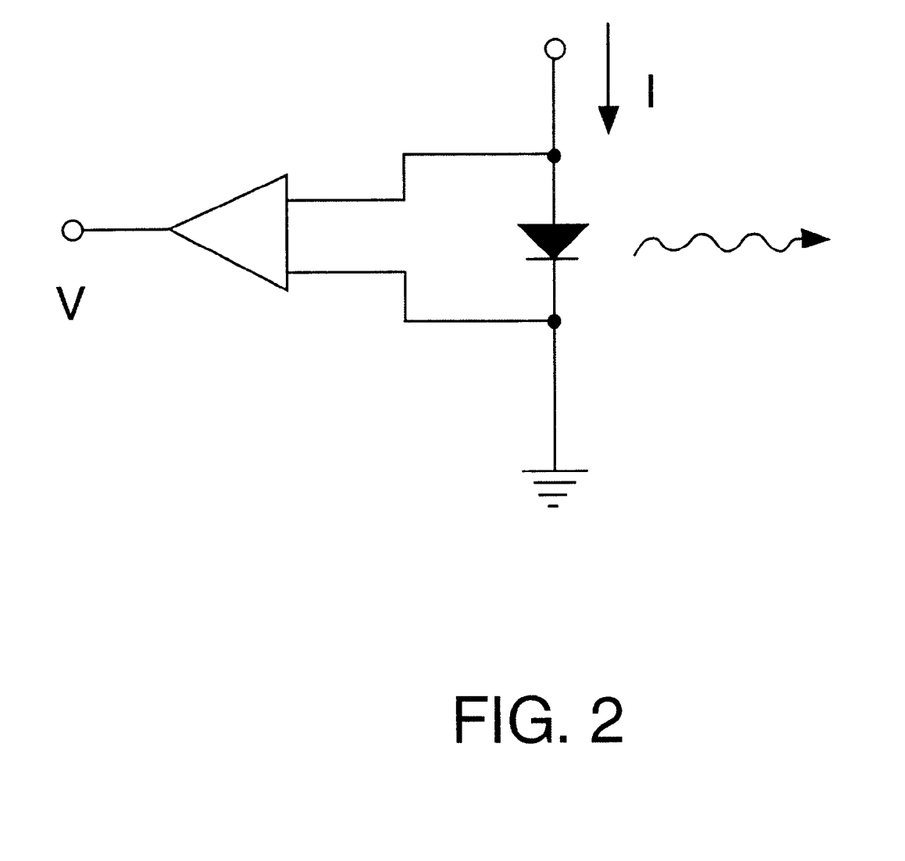
FIG. 2 is a schematic diagram illustrating a voltage detection circuit in accordance with the present invention.

A first electrical contact 34 is coupled to n-semiconductor substrate 26 and is in electric communication with n-clad layer 20. A second electrical contact 36 is coupled to, and in electric communication with, p-clad layer 22. Contacts 34, 36 are configured and positioned to apply a current across the diode structure defined by laser 14 in a conventional manner. A voltage detection circuit 38 is operatively coupled to electrical contacts 34, 36 via conductors 40, 42 respectively. Voltage detection circuit 38 is of conventional configuration, and is shown in FIG. 2 as a simple op-amp and diode circuit. Detection circuit 38 may alternatively utilize a comparator (not shown) which compares voltage detected from contacts 34, 36 to a reference voltage, and which outputs a signal indicative of detected voltage which exceeds a reference voltage. Voltage detection circuit 38 may additionally include various filtering and amplification components. Numerous designs for voltage detection circuits usable with the invention will suggest themselves to those skilled in the art upon reviewing this disclosure, and are considered to be within the scope of the invention.

An optical detector 44 may alternatively, or additionally, be associated with laser 14. Optical detector 44 is positioned adjacent rear emission facet 18 to detect optical output therefrom. Optical detector 44 is of conventional design, and may be integral to n-substrate 26 such that optical detector 44 and laser 14 comprise a single, monolithic device fabricated from the same base semiconductor substrate.

Optical medium 12, in the embodiment of FIG. 1, is shown as comprising a protective, outer overcoat layer 45, a first dielectric layer 46, and a read/write layer 47, a second dielectric layer 48, a metal layer 49, a third dielectric layer 50, and a base or substrate 51. Dielectric layers 46, 48 provide thermal and mechanical barriers, as is well known in the art, and may comprise a variety of well known dielectric materials. Metal layer 49 and dielectric layer 50 likewise preferably comprise well known materials. Substrate 51 may comprise a variety of conventional glasses, metals or plastics.

Read/write layer 47 may comprise any material which undergoes an optically detectable change upon writing thereon with laser 14. Such materials include, for example, magneto-optic, dye, dye-polymer blend, ferroelectric, photoresist, ablative, WORM and other materials. In one preferred embodiment, layer 47 comprises a phase change material which allows reversible, optically detectable phase changes. In one particularly preferred embodiment, the phase change material of layer 47 comprises GeTeSb alloy which can undergo phase changes between a polycrystalline phase 52 with a first, relatively high reflectivity, and an amorphous phase 53 with a second, relatively low reflectivity. In order to effect writing on medium 12, output from laser 14 is used to locally heat the high reflectivity polycrystalline region 52 above its melting point to create amorphous melt spots or regions 53 of relatively low reflectivity. Readout is obtained by flying laser 14 over optical medium 12 and measuring the changes in reflection associated with the low reflectivity amorphous melt spots 53 and higher reflectivity unmelted, polycrystalline regions 52, as discussed further below. Erasure is effected by heating the phase change layer 48 above the crystallization temperature to return layer 48 to a polycrystalline state.

The preferred GeTeSb phase change materials have a melting temperature suitable for writing, and provide melt spot sizes comparable size to the area of aperture 32 on emission facet 16. In embodiments utilizing these materials, the optical media provide a low reflectivity of around 0.7% from amorphous regions 53, and a high reflectivity of around 34% from polycrystalline regions 52. Erasure is achieved by heating layer 48 to return the amorphous phase regions 53 back to a polycrystalline phase. The preferred GeTeSb materials have shown a reliable rewritability over a large number of cycles, and fast crystallization times which allow high writing rates.

The apparatus 10 is generally used in conjunction with optical medium 12. Laser 14 is generally mounted on an aerodynamic slider (not shown) associated with an optical head (also not shown) in a standard fashion, such that laser 14 can "fly" over the surface of medium 12 during read and write operations. During near-field reading and writing operation, laser 14 is generally spaced apart from medium 12 by an optical path length d. The optical path length d is defined generally by $d=\int n(z)dz$, where z measures the distance between aperture 32 and read/write layer 47, and n(z) is the index of refraction as a function of distance z, which comprises generally the refractive index of the air gap, outer layer 45, dielectric layer 46, as well as any additional material layers between outer layer 45 and read/write layer 47. Preferably, emission facet 16 is positioned with respect to medium 12 during operation such that the path length d is less than the output wavelength λ (d<λ) of laser 14, and also preferably such that the internal mode of laser 14 substantially matches the external mode between the reflective surface of optical medium 12 and front emission facet 16. More preferably, the path length d is less than one half of the width w of aperture (d<w/2). The output beam from laser 14 will generally stay collimated for a distance equal to about one half the width w of aperture 32. Once again, it should be noted that the distances and dimensions shown in FIG. 1 are not necessarily to scale, and are merely exemplary.

The invention may be used with optical media containing various types of different optical read/write materials, including magneto-optic, ferroelectric, dye, dye-polymer, photoresist, or ablative materials, or any materials generally which undergo an optically detectable phase change upon writing with laser 14. The GeTeSb phase change material may also be used such that the written spots provide a crystalline, higher reflectivity phase while the background is an amorphous low reflectivity phase. Various other optical media compositions and configurations will suggest themselves to those skilled in the art, and are considered to be within the scope of this disclosure.

The presently disclosed laser output wavelength λ, for use with reading and writing of GeTeSb phase change media as described above, is 980 nm, which is provided by edge emitting and surface emitting semiconductor lasers using GaAs/InGaP/AlGaAs/InAs semiconductor materials and well known structures. This particular output wavelength and type of semiconductor laser and materials is only exemplary, of course, and other laser types may be used with the invention for different types of optical media.

During operation, the threshold current and output intensity of laser 14 will vary generally according to feedback light reflected back into laser 14 from optical medium 12. The reflective polycrystalline regions 52 provide generally a first, high reflectivity feedback to laser 14, while amorphous, low reflectivity spots 53 in medium 12 provide a second, lower reflectivity feedback to laser 14. As a result, the output power from laser 14 will generally fluctuate as laser 14 flies over medium 12, as will the density of carriers resident in the active region layer 24 of the laser 14. Readout is carried out by monitoring and detecting these fluctuations in output power and carrier density, either optically via optical detector 44, or by voltage detector 38 according to the corresponding voltage fluctuations across contacts 34, 36.

The invention advantageously provides operating conditions for laser 14 wherein, under both high and low reflective feedback conditions under constant bias current, fluctuation in output power from front emission facet 16 is minimal, while the output power from rear emission facet 18 is relatively substantial. In other words, while under constant bias current, the power outputs from front emission facet 16 is substantially the same or similar under both high and low reflectivity feedback conditions, while the power output from rear emission facet 18 under high reflectivity feedback is substantially different from the power output under low reflectivity feedback.

The relatively stable output power emitted from front facet 16 facilitates writing at high data rates, while the notable fluctuation in output power emitted from rear facet 16 facilitates readout via optical detector 44 or voltage detector 38. The preferred input parameters and dimensional considerations for laser 14, as required to provide minimal output power fluctuation from front facet while providing substantial output power fluctuation from rear facet 16, are based on mirror loss, threshold current, carrier density and gain coefficient considerations.

The basic operating considerations for semiconductor lasers are described Agrawal et al. In "Semiconductor Lasers", Second Edition, Van Nostrand Reinhold, New York (1993). This publication by Agrawal et al is well known in the art, and its disclosure is incorporated herein by reference. As noted by Agrawal et al., power $P_{out}$ for a semiconductor laser with mirror modulation at constant drive current can be described as $$P_{out} = \frac{h\nu}{q} \frac{\eta_i \alpha_m}{\alpha_m + \alpha_{int}} (I - I_{th}) \Gamma$$

where $\Gamma = \Gamma(R_1)$ = the fraction of power emitted from the laser front facet 16, $\alpha_m = \alpha_m(R)$ = mirror losses, h=Planck's constant, $\nu$=frequency of the laser output light, q=the charge on an electron, I=current, $I_{th}$=threshold current, $\alpha_{int}$=internal loss, and $\eta_i$=quantum efficiency. The mirror losses $\alpha_m$ are characterized generally by $$\alpha_m = \frac{1}{2L} \ln\left(\frac{1}{R_1 R_2}\right)$$

where $R_1$, $R_2$ respectively are the reflectivities of front and rear facets 16, 18, and L=the length of the laser cavity.

The fraction of power $\Gamma(R_1)$ emitted from the front facet is represented by $$\Gamma(R_1) = \frac{(1 - R_1)\sqrt{R_2}}{\left(\sqrt{R_1} + \sqrt{R_2}\right)\left(1 - \sqrt{R_1 R_2}\right)}$$

The threshold current $I_{th}(R_1)$ can be shown generally by $$I_{th} = I_{th}(R_1) = \frac{qv}{\tau_e}\eta_{th} = \frac{qv}{\tau_e}\left[n_o + \frac{\alpha_m + \alpha_{int}}{a}\right]\Gamma'$$

where $n_o$=transport carrier density, a=gain coefficient, $\Gamma'$=an overlap factor, $\tau_e$=the electron recombination rate, and $\eta_{th}$= the threshold carrier density.

With the above in mind, the laser output power $P_{out}$ can be defined as $$P_{out} = \frac{h\nu}{q}\eta_1 \frac{\ln\frac{1}{R_1 R_2}}{\ln\frac{1}{R_1 R_2} + 2L\alpha_i}\left(I - \frac{qv}{\tau_e}\left[n_0 + \left(\frac{\ln\frac{1}{R_1 R_2} + 2L\alpha_{int}}{2L\alpha\Gamma}\right)\right]\right)\Gamma$$

For phase change media with good reflectivity variation, a substantial modulation of the rear facet power output is predicted for a small aperture laser 14, with relatively minimal change in the front facet emission. The presently preferred input parameters for a small aperture edge emitter laser 14 in accordance with the invention are shown in Table 1. The parameters of Table 1 are shown for conditions with no recording medium present, for an adjacent crystalline (high reflectivity) section 52 of medium 12, and for an adjacent amorphous (low reflectivity) portion 53 of medium.

TABLE 1

| Parameter | No Medium | Crystalline | Amorphous | Abs. Change | % Change |
|---|---|---|---|---|---|
| Wavelength, nm | 980 | 980 | 980 | — | — |
| Photon Energy, Ev | 1.26507143 | 1.26507143 | 1.26507143 | — | — |
| Quantum Efficiency | 1 | 1 | 1 | — | — |
| Internal Loss, 1/cm | 24.3 | 24.3 | 24.3 | — | — |
| Cavity Length, μm | 750 | 750 | 750 | — | — |
| Stripe Width, μm | 2.5 | 2.5 | 2.5 | — | — |
| Active Thickness, μm | 0.014 | 0.014 | 0.014 | — | — |
| Rear Facet Reflectivity | 0.9 | 0.9 | 0.9 | — | — |
| Front Facet Reflectivity | 0.000994444 | 0.00290833 | 0.00103333 | −0.001875 | −64.46999% |
| Mode Area, $nm^2$ | 450000 (1500 × 300 nm) | 450000 (1500 × 300 nm) | 450000 (1500 × 300 nm) | — | — |
| Mode Reflectivity | 0.001 | 0.001 | 0.001 | — | — |
| Aperture Area, $nm^2$ | 2500 (50 × 50 nm) | 2500 (50 × 50 nm) | 2500 (50 × 50 nm) | — | — |
| Aperture Reflectivity | 0 | 0.3445 | 0.007 | — | — |
| Linearized Gain Coeff., $cm^2$ | 2.50E−16 | 2.50E−16 | 2.50E−16 | — | — |
| Electronic Charge, Coul. | 1.61E−19 | 1.61E−19 | 1.61E−19 | — | — |
| Transp. Carrier Density, $1/cm^3$ | 4.25E−18 | 4.25E−18 | 4.25E−18 | — | — |
| Carrier Lifetime, ns | 2 | 2 | 2 | — | — |
| Overlap Factor | 0.05 | 0.05 | 0.05 | — | — |
| Drive Current, mA | 40 | 40 | 40 | — | — |
| Mirror Loss, 1/cm | 46.7912456 | 39.6369041 | 46.5355065 | +6.898602 | +17.4045% |
| Threshold Carrier Density | 9.94E+18 | 9.36E+18 | 9.92E+18 | +5.52E+17 | +5.8931% |
| Transp. Current Density, $A/cm^2$ | 479 | 479 | 479 | — | — |
| Thresh. Current Density, $A/cm^2$ | 1120 | 1050 | 1120 | — | — |
| Threshold Current, mA | 21.0 | 19.8 | 20.9 | +1.165484 | +5.8931% |
| Cavity Photon Emission Rt, mW | 15.83228361 | 15.860185 | 15.838507 | −0.021678 | −0.1367% |
| Front Facet Power Fraction | 0.996683665 | 0.99433113 | 0.99661953 | +0.002288 | +0.2301% |
| Rear Facet Power Fraction | 0.003316335 | 0.00566887 | 0.00338047 | 0.002288 | −40.3678% |
| Front Facet Power, mW | 15.77977845 | 15.7702756 | 15.7849653 | +0.01469 | +0.0931% |
| Rear Facet Power, mW | 0.052505162 | 0.08990939 | 0.05354163 | −0.036368 | −40.4493% |

The input parameters of Table 1 are based on the modeling of aperture 32 according to a composite mirror with net reflectivity equal to the weighted average of the reflectivies of the mirror and the aperture 32 as seen through the mirror. The parameters of Table 1 are also based on use with an optical medium 12 which has a crystalline phase upper reflectivity $R_{high}$ of approximately 34%, and an amorphous phase lower reflectivity $R_{low}$ of approximately 0.7%. This type of optical medium is provided by the crystalline and amorphous phases of GeTeSb materials, as noted above.

The parameters in Table 1 for "no medium" (second column) are associated with no (zero) optical feedback reflected into laser 14, when optical medium 12 is not present. The parameters for crystalline media (third column) are associated with higher optical feedback to laser 14 due to the higher reflectivity of the crystalline phase, while the parameters for amorphous media (fourth column) are associated with lower optical feedback to laser 14 due to the lower reflectivity of the amorphous phase. The absolute change and % change values (the two right-most columns) in Table 1 refer to the change from a crystalline to an amorphous region of medium 12.

As can be seen from Table 1, the output power from front facet 16 undergoes a change of less than 0.01% due to the difference in optical feedback associated with high reflectivity (polycrystalline) regions 52 and low reflectivity (amorphous) regions 53 of medium. At the same time, the output power from rear facet 18 undergoes a change or fluctuation of greater than 40% under the same conditions. As noted above, the relatively constant output power emitted from front facet 16 advantageously allows relatively constant writing conditions for both amorphous and crystalline states. The relatively large change or fluctuation in output power emitted from rear facet 18 simultaneously allows easy and accurate readout via voltage detection or optical detection. A single mode laser 14 can thus operate at a first constant bias current for writing and a second constant bias current for reading.

Figure 3:
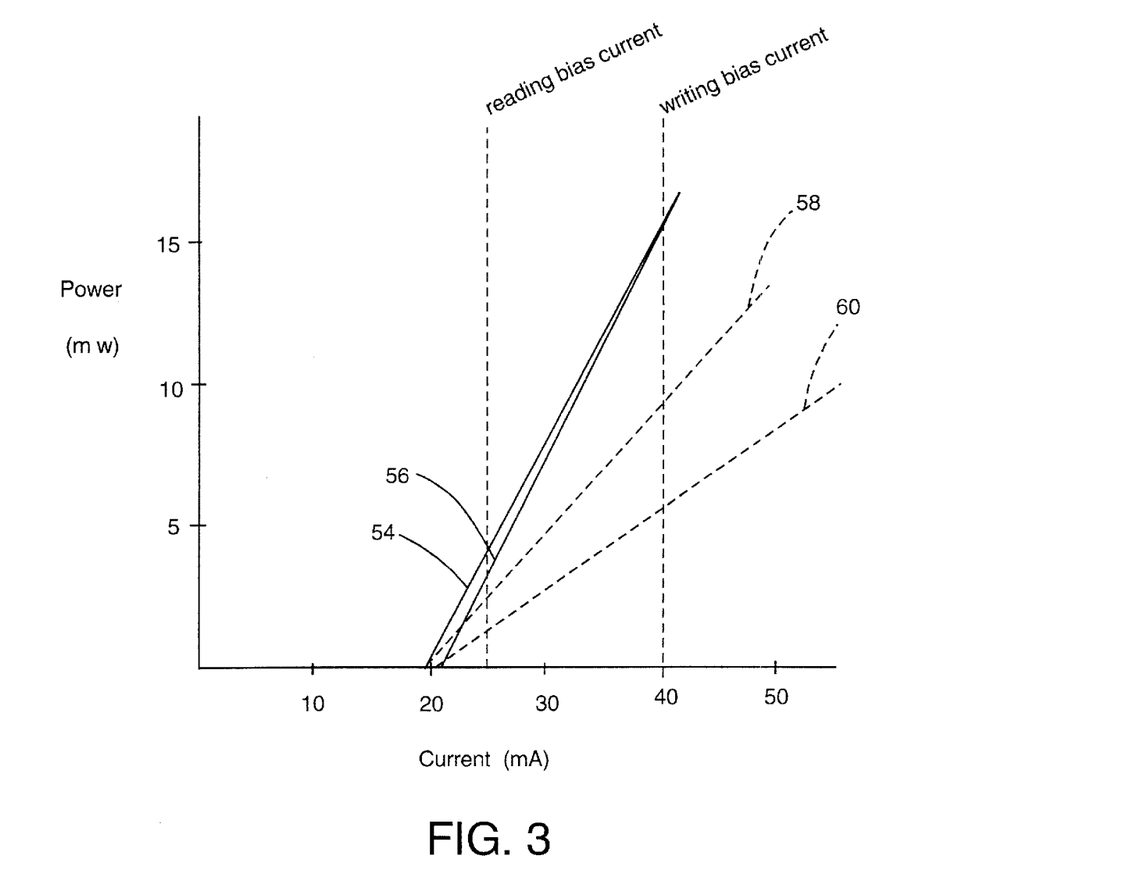
FIG. 3 is a graphical representation, shown as output power versus current, illustrating preferred bias levels for the near-field laser and detector apparatus of FIG. 1, and showing writing and reading levels.

As can also be seen from Table 1, the drive current or bias current for laser 14 is maintained well above the threshold current. The relationship of the bias current for laser 14 to the output power of front and rear facets 16, 18 is illustrated graphically in FIG. 3. In FIG. 3, output power is shown along the vertical or "y"-axis in milli-Watts, and current in milli-Amps is shown along the horizontal or "x"-axis. Solid line 54 represents the change in output power with respect to current for front facet 16 associated with feedback from the reflective, crystalline phase 52 of medium 12, while solid line 56 represents the change in output power with respect to current for front facet 16 associated with feedback from the low reflectivity, amorphous phase 53 of medium 12. Dashed line 58 represents the change in output power with respect to current for rear facet 18 associated with feedback from the reflective, crystalline phase 52 of medium 12, while dashed line 60 represents the change in output power with respect to current for rear facet 18 associated with feedback from the low reflectivity, amorphous phase 53 of medium 12.

For the modeled parameters above, the threshold current for laser 14 associated with optical feedback from high reflectivity, crystalline phase regions 52, is approximately 19.8 mA, as shown in Table 1, and in FIG. 3 by the intersection of lines 54, 58 with the horizontal axis. The threshold current for laser 14 associated with optical feedback from low reflectivity, amorphous phase regions 53, is approximately 20.9 mA, as is also shown in Table 1, and in FIG. 2 by the intersection of lines 56, 60 with the horizontal axis. In this embodiment the threshold current of 19.8 mA associated with high reflectivity feedback is substantially the same as or similar to the threshold current of 20.9 mA associated with low reflectivity feedback.

The drive or bias current for laser 14 during both reading and writing is maintained well above the threshold currents associated with high and low reflectivity feedback to laser 14. During writing, laser 14 is preferably operated at a bias current of approximately 40 mA to provide sufficient power to perform writing on GeTeSb phase change media. Under this constant bias current during writing, the power output from front emission facet 16 of laser 14 is substantially the same under both high and low reflectivity feedback conditions, as indicated by the intersection of solid lines 54, 56 proximate to the bias current of 40 mA. In other words, under a constant bias current, the fractional change or difference between the front facet output powers associated with high and low reflectivity feedback is minimal.

Readout is preferably carried out at a bias current of about 24 mA, which provides sufficient power flux for a good signal to noise ratio while avoiding excessive heating of the GeTeSb material. Under this constant bias current during writing, the output power from rear emission facet 18 is substantially different under high and low reflectivity feedback conditions, as can be seen by the divergence of dashed lines 58, 60 at the reading bias current of 24 mA. In other words, under a constant bias current, the fractional change or difference between the rear facet output powers associated with high and low reflectivity feedback is relatively large, such that the fractional change in front facet output powers associated with high and low reflectivity feedback, is less than or smaller than the fractional change in rear facet output powers associated with high and low reflectivity feedback.

The particular bias currents for reading and writing as shown in FIG. 3 and described above are exemplary, and will necessarily be different for different optical media and different uses of the invention. However, the bias current across laser 14 during both writing and reading operations is preferably always maintained well above the threshold currents associated with feedback under high reflectivity and low reflectivity conditions.

In the specific example illustrated in Table 1 and FIG. 3, the bias current during writing is about twice the threshold current values at 19.8 mA and 20.9 mA, while the bias current during readout is about 20% to 25% higher than the threshold current values. Once again, these particular current levels will necessarily vary according to the particular use of the invention.

Voltage changes across diode laser 14 are generally modulated together as mirror reflectivity changes. The voltage aspects for semiconductor lasers are discussed in detail in "Computer Aided Design of Optoelectronic Integrated Circuits and Systems" by J. Morikuni et al., Prentice Hall PTR, Upper Saddle River, N.J. (1997). This work by Morikuni et al. is well known in the art and is incorporated herein by reference. For laser 14, having a quantum well of width $L_z$ in active region 24, carrier density n can be shown by $$n = \frac{m_c^* kT}{\pi \hbar^2 L_z} \ln\left[1 + \exp\left(\frac{E_{FC} - E_{Cl}}{kT}\right)\right]$$

where k is the Boltzman constant, T=temperature, m* is a mass effect, $E_{FC}$ is the effective Fermi level conduction band, and $E_{CL}$ is the first conduction sub-band. For an approximated bulk gain region in a degenerate semiconductor, n is described by $$n = \frac{1}{2}\left(\frac{8m^* kT}{\pi \hbar^2}\right)^{\frac{3}{2}} \frac{1}{(1/2)!} \int_0^\infty \frac{x^{1/2}}{1 + \exp(F_C - x)} dx$$

where $F_c$ equals the quasi-fermi level in the conduction band. The above equation is somewhat difficult to solve, and can be reasonably approximated by $$n = n_o \exp\left[\frac{qV}{n_i kT}\right]$$

where n is the carrier density, $n_i$ is an ideality factor, and $\eta_o$, is the equilibrium carrier density, which varies with reflectivity as noted above. In order for effective voltage detection, the voltage change in relation to carrier density can be calculated by $$n_1 = n_o e^{\frac{qV_1}{n_i kT}}$$

and $$n_2 = n_o e^{\frac{qV_2}{n_i kT}}$$

and thus $$\frac{n_1}{n_2} = e^{\frac{q(V_1 - V_2)}{n_i kT}}$$

From the above it can be seen that $$\ln\frac{n_1}{n_2} = q\frac{(V_1 - V_2)}{n_i k t}$$

and thus $$V_1 - V_2 = \Delta V = \frac{n_i k T}{q}\ln\frac{n_1}{n_2}$$

within approximation of non-degenerate carrier densities. Thus, for laser 14 as used with phase change medium 12 as described above, voltage detection provides an effective readout.

The large bias current across diode laser 14 as described above raises some noise considerations for readout by voltage modulation, and as to how optical intensity noise is associated with carrier density noise, and in turn how carrier density noise is associated with voltage noise. Noise aspects of semiconductor lasers are discussed in detail in "Physics of Optoelectronic Devices" by S. L. Chuang, John Wiley and Sons, Inc., New York (1995). This work is well known in the art and is incorporated herein by reference. The main noise considerations for laser 14 include shot noise, generation-recombination (GR) noise, thermal noise, and laser relational intensity noise (RIN). Shot noise is represented generally by $$<I^2(f)> = 2q<I>\Delta f$$

Where f is frequency and $\Delta f$ is frequency bandwidth. The GR noise can be shown by $$\langle I_{GR}^2 \rangle = \frac{4qI_p\left(\frac{\tau_n}{\tau_t}\right)\Delta f}{1 + (2\pi f \tau_n)^2}$$

where $\tau_n$ is average electron lifetime, $\tau_t$ is mean transit time, and $I_p$ is photocurrent. Thermal noise is related generally by $$\langle I_T^2 \rangle = \frac{4k_B T \Delta f}{R}.$$

where R is equivalent circuit resistance, T is temperature, and $k_b$ is the Boltzmann constant.

It is assumed generally that laser relational intensity noise (RIN) does not result in voltage modulation, due to damping of carrier density at a value to compensate losses. From the above, it thus appears that shot noise will dominate over all other noise sources when laser 14 is operated under p-n diode forward bias conditions. Noise currents in the $\mu A$ range and a $\Delta f$ of about 100 MHz will thus be expected to occur during operation of laser 14 at a drive current of 40 mA.

Figure 4:
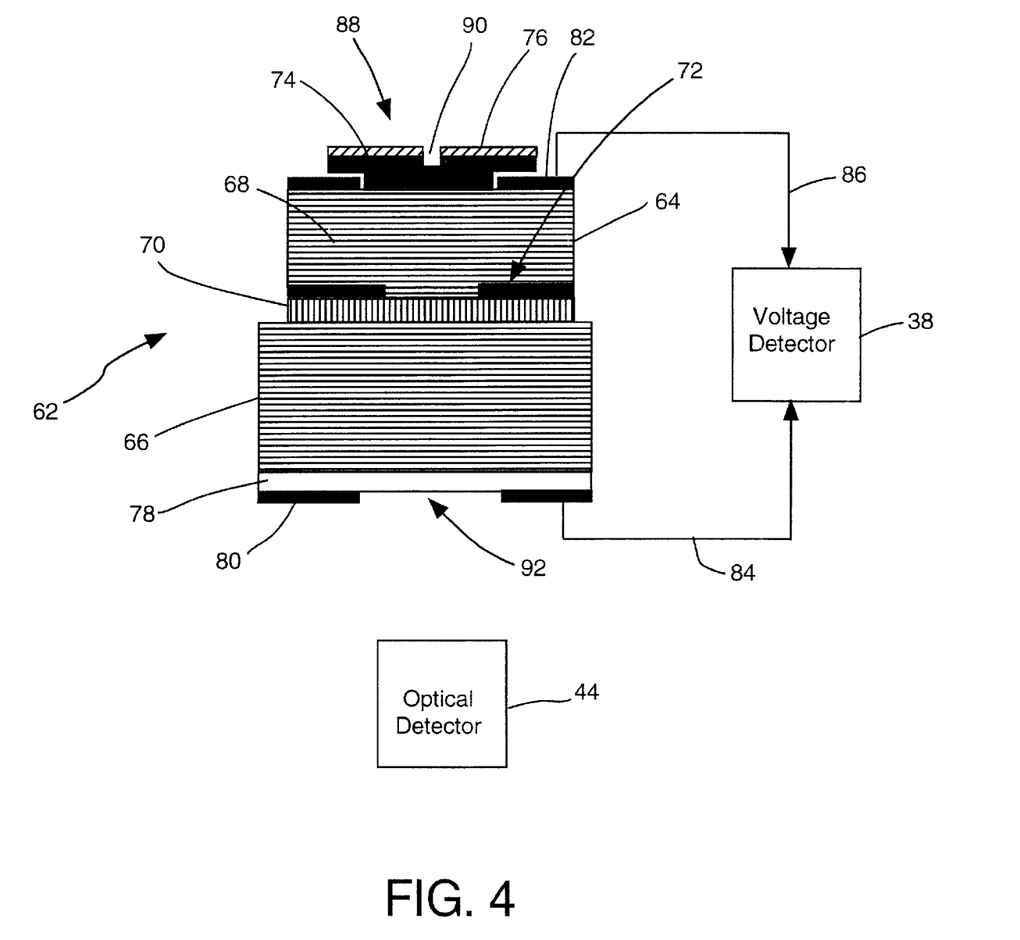
FIG. 4 is a schematic side elevation view, in partial cross-section, of an alternative embodiment near-field laser and detector apparatus in accordance with the present invention.

Referring now to FIG. 4, there is shown an alternative preferred embodiment laser and detector apparatus 62 in accordance with the invention, where like reference numbers are used to denote like parts. The apparatus 62 includes a laser 64 which is structured and configured as a vertical cavity surface emitting laser or VCSEL. Laser 64 includes a first conductivity-type clad layer shown as a lower, n-doped set of distributed Bragg reflector or DBR mirrors 66, and a second conductivity-type clad layer adjacent an upper, p-doped set of distributed Bragg reflector or DBR mirrors 68. The DBR mirrors in stacks 66, 68 each comprise a plurality of quarter wave ($\lambda/4$) dielectric pairs of semiconductor material. A multiple quantum well/quantum barrier active region layer 70 is positioned between DBR mirror sets 66, 68. An oxide or ion implanted region 72 in p-DBR mirror set 66 defines a mode for laser 64. A dielectric layer 74 is positioned on top of p-DBR mirror set 66, and a reflective outer metal layer 76 is positioned on top of dielectric layer 74. Laser 64 is grown on an n-semiconductor substrate 78 by well known deposition techniques. Laser 64 may be structured in a variety of configurations, and is shown in cross-section.

An n-side electrical contact 80 is coupled to n-substrate 78, and a p-side electrical contact 82 is coupled to p-DBR mirror set 68, which are used to drive laser 64 in a conventional manner. A voltage detector 38 is operatively coupled to n-contact 80 and p-contact 82 by conductors 84, 86 respectively.

A first, front emission facet 88 is defined by dielectric layer 74 and metal layer 76. Front emission facet 88 is generally circular in shape and is surrounded by p-contact 82. The materials used for dielectric layer 74 and metal layer 76 are generally similar to those described for laser 14 above. An aperture 90 is etched through metal layer 76, and serves to narrow the beam spot from emission facet 88 for near-field read/write use in the manner described above. In this regard, aperture 90 has a width w which is smaller than the output wavelength $\lambda$ of laser 64. The n-contact 80 may be structured and configured to provide a second, rear emission facet 90, so that an optical detector 44 can be positioned proximate thereto for readout of output from rear emission facet 90.

The laser and detector apparatus 62 is used together with an optical medium (not shown) which is generally the same as optical medium 12 described above. In this regard, laser 64 is positioned with respect to the optical medium such that front facet 88 is separated from the optical medium by a distance d which is smaller than the output wavelength $\lambda$ of laser 64, and such that the internal mode of laser 64 substantially matches the external mode between the reflective surface the optical medium and front emission facet 88.

The laser and detector apparatus 62 operates in a manner similar to that described above for the apparatus 10 of FIG. 1. Laser 64 is associated with an slider and optical head (not shown) in a conventional manner. Writing is carried out by melting portions of the polycrystalline phase change material with laser 64 to create melts spots of size and shape according to the size and shape of aperture 90. Readout is achieved by flying laser 64 over the optical medium and measuring the changes in reflectivity associated with low reflectivity amorphous melt spots and higher reflectivity, unmelted, polycrystalline regions, as related above.

As described above, the threshold current and output intensity of laser 64 are responsive to feedback light reflected back into laser 14 from the optical medium, with the amorphous, low reflectivity spots in the medium providing generally less reflective feedback to laser 64, while the high reflectivity polycrystalline regions providing greater reflective feedback The drive current or bias current for laser 64 is maintained well above the threshold currents associated with both high and low reflectivity feedback. By operating at a bias current above the threshold currents, a relatively high level output intensity is emitted from front facet 88 which undergoes minimal change or fluctuation according to changes in reflective feedback to facilitate writing. At the same time, the output power from rear facet 92 undergoes substantial change according to reflective feedback, which facilitates readout by either voltage detection of voltage fluctuation across laser 64 via voltage detector 38, by via optical detection of the output from rear facet 92 by optical detector 44. In this manner, laser 64 can be operated optimally in a single mode for both read and write operations, as noted above.

Accordingly, it will be seen that this invention provides a near-field laser and detection apparatus which allows both reading and writing operations to be carried out by a single laser operating in a single mode, and which provides high data rates. Although the description above contains many specificities, these should not be construed as limiting the scope of the invention but as merely providing an illustration of the presently preferred embodiment of the invention. Thus the scope of this invention should be determined by the appended claims and their legal equivalents.

What is claimed is:

1. A near-field optical apparatus comprising:
   (a) a semiconductor laser having a bias current which is higher than a threshold current associated with optical feedback from a high reflectivity portion of an optical medium, said semiconductor laser having a first emission facet with an aperture, wherein said semiconductor laser has an output wavelength, and said aperture in said first emission facet has a width such that said width is less than said wavelength; and
   (b) a voltage detector associated with said semiconductor laser and configured to detect voltage fluctuation associated with optical feedback from said optical medium to said semiconductor laser.

2. The near-field optical apparatus of claim 1, wherein said semiconductor laser comprises:
   (a) a first conductivity-type clad region;
   (b) a second conductivity-type clad region;
   (c) an active region positioned between said first conductivity-type clad region and said second conductivity-type clad region;
   (d) a first electrical contact associated with said first conductivity type clad region and coupled to said voltage detector; and
   (e) a second electrical contact associated with said second conductivity type clad region and coupled to said voltage detector.

3. The near-field optical apparatus of claim 2, wherein said semiconductor laser is an edge emitting laser having first and second emission facets.

4. The near-field optical apparatus of claim 2, wherein said semiconductor laser is a vertical cavity surface emitting laser having at least one emission facet.

5. A near-field optical apparatus, comprising:
   (a) a semiconductor laser having a first emission facet and a second emission facet, said first emission facet having an aperture therein, wherein said semiconductor laser as an output wavelength $\lambda$, and said aperture in said first emission facet has a width w such that $w<\lambda$;
   (b) said semiconductor having an operating bias current greater than a first threshold current associated with optical feedback from a high reflectivity portion of an optical medium, and greater than a second threshold current associated with optical feedback from a low reflectivity portion of an optical medium; and
   (b) a voltage detector associated with said semiconductor laser and configured to detect voltage fluctuation associated with optical output from said second emission facet of said semiconductor laser.

6. The near-field optical apparatus of claim 5, wherein said first emission facet is positioned opposite said optical medium and separated from said optical medium by a distance d such that $d<\lambda$.

7. The near-field optical apparatus of claim 6, wherein said first emission facet is positioned opposite said optical medium and separated from said optical medium by a distance d such that $d<w/2$.

8. The near-field optical apparatus of claim 5, wherein said semiconductor laser comprises:
   (a) a p-type clad region;
   (b) an n-type clad region;
   (c) an active region positioned between said p-type clad region and said n-type clad region;
   (d) a first electrical contact associated with said p-type clad region and coupled to said voltage detector; and
   (e) a second electrical contact associated with said n-type clad region and coupled to said voltage detector.

9. The near-field optical apparatus of claim 8, wherein said semiconductor laser is an edge emitting laser.

10. The near-field optical apparatus of claim 8, wherein said semiconductor laser is a vertical cavity surface emitting laser.

11. The near-field optical apparatus of claim 5, wherein said bias current results in an output power from said first emission facet which is greater than an output power from said second emission facet.

12. The near-field optical apparatus of claim 11, wherein said output power from said second emission facet undergoes fluctuation, according to said optical feedback from said high reflectivity regions and said low reflectivity regions of said optical medium, which is greater than fluctuation in output power from said first emission facet according to said optical feedback from said high reflectivity regions and said low reflectivity regions of said optical medium.

13. A near-field optical apparatus, comprising:
   (a) a semiconductor laser having a first emission facet having an aperture therein and a second emission facet opposite thereof;
   (b) said semiconductor having a first, writing bias current and a second reading bias current, said first and second bias currents greater than a first threshold current associated with optical feedback from high reflectivity portion of an optical medium, and greater than a second threshold current associated with optical feedback from a low reflectivity portion of an optical medium;
   (c) a voltage detector associated with said semiconductor laser and configured to detect voltage fluctuation associated with optical output from said second emission facet of said semiconductor laser; and
   (d) an optical detector positioned adjacent said second emission facet and configured to detect fluctuation in output power.

14. A near-field optical system, comprising:
   (a) a semiconductor laser including an output wavelength $\lambda$ and having a first emission facet and a second emission facet, said first emission facet having an aperture therein of width w such that $w<\lambda$;
   (b) an optical medium including high reflectivity regions and low reflectivity regions, said optical medium positioned opposite said first emission facet and separated from said first emission facet by a distance d such that $d<\lambda$; and
   (c) said semiconductor having a bias current which is greater than a first threshold current associated with optical feedback from said high reflectivity portion of said optical medium and which is greater than a second threshold current associated with optical feedback from a low reflectivity portion of an optical medium.

15. The near-field optical system of claim 14, further comprising a voltage detector associated with said semiconductor laser and configured to detect voltage fluctuation associated with said optical feedback from said optical medium.

16. The near-field optical system of claim 14, further comprising an optical detector, positioned adjacent said second emission facet and configured to detect fluctuation in output power associated with said optical feedback from said reflective medium.

17. The near-field optical system of claim 14, wherein said bias current results in an output power from said first emission facet which is greater than an output power from said second emission facet.

18. The near-field optical apparatus of claim 17, wherein said output power from said second emission facet undergoes fluctuation, associated with said optical feedback from said high reflectivity regions and said low reflectivity regions of said optical medium, which is greater than fluctuation in output power from said first emission facet associated with said optical feedback from said high reflectivity regions and said low reflectivity regions of said optical medium.

19. The near-field optical apparatus of claim 14, wherein said first emission facet is positioned opposite said optical medium and separated from said optical medium by a distance d such that d<w/2.

20. A near-field optical system, comprising:
(a) a semiconductor laser having a front emission facet, said semiconductor laser operating at a constant bias current; and
(b) an optical medium having portions of a first reflectivity and portions of a second reflectivity;
(c) said front emission facet having a first output power associated with feedback from said first reflectivity portions of said optical medium, and a second output power associated with feedback from said second reflectivity portions of said optical medium, said first output power substantially similar to said second output power.

21. The near-field optical system of claim 20, wherein said semiconductor laser further comprises a rear emission facet, said rear emission facet having a first output power associated with said feedback from said first reflectivity portions of said optical medium, and a second output power associated with said feedback from said second reflectivity portions of said optical medium, said first output power substantially different from said second output power.

22. The near-field optical system of claim 20, wherein said semiconductor laser has a first threshold current associated with said feedback from said first reflectivity portions of said medium, and a second threshold current associated with said feedback from said second reflectivity portions of said medium, said constant bias current of said semiconductor greater than said first threshold current and said second threshold current.

23. The near-field optical system of claim 22, wherein said first threshold current is substantially similar to said second threshold current.

24. A near-field optical system, comprising:
(a) a semiconductor laser having a rear emission facet, said semiconductor laser operating at a constant bias current; and
(b) an optical medium having portions of a first reflectivity and portions of a second reflectivity;
(c) said rear emission facet having a first output power associated with feedback from said first reflectivity portions of said optical medium, and a second output power associated with feedback from said second reflectivity portions of said optical medium, said first output power substantially different from said second output power.

25. The near-field optical system of claim 24, wherein said semiconductor laser further comprises a front emission facet, said front emission facet having a first output power associated with said feedback from said first reflectivity portions of said optical medium, and a second output power associated with said feedback from said second reflectivity portions of said optical medium, said first output power substantially similar to said second output power.

26. The near-field optical system of claim 24, wherein said semiconductor laser has a first threshold current associated with said feedback from said first reflectivity portions of said medium, and a second threshold current associated with said feedback from said second reflectivity portions of said medium, said constant bias current of said semiconductor greater than said first threshold current and said second threshold current.

27. The near-field optical system of claim 26, wherein said first threshold current is substantially similar to said second threshold current.

28. A near-field optical system, comprising:
(a) a semiconductor laser having a front emission facet and a rear emission facet, said semiconductor laser operating at a constant bias current;
(b) an optical medium having regions of a first reflectivity and regions of a second reflectivity;
(c) said front emission facet having a first output power associated with feedback from said first reflectivity portions of said optical medium, and a second output power associated with feedback from said second reflectivity portions of said optical medium, said first output power of said front emission facet substantially similar to said second output power of said front emission facet; and
(d) said rear emission facet having a first output power associated with said feedback from said first reflectivity portions of said optical medium, and a second output power associated with said feedback from said second reflectivity portions of said optical medium, said first output power of said rear emission facet substantially different from said second output power of said rear emission facet.

29. The near-field optical system of claim 28, wherein said semiconductor laser has a first threshold current associated with said feedback from said first reflectivity portions of said medium, and a second threshold current associated with said feedback from said second reflectivity portions of said medium, said constant bias current of said semiconductor greater than said first threshold current and said second threshold current.

30. The near-field optical system of claim 29, wherein said first threshold current is substantially similar to said second threshold current.

31. A near-field optical system, comprising:
(a) a semiconductor laser having a front emission facet and a rear emission facet, said semiconductor laser operating at a constant bias current;
(b) an optical medium having regions of a first reflectivity and regions of a second reflectivity;
(c) said front emission facet having a first output power associated with feedback from said first reflectivity portions of said optical medium, and a second output power associated with feedback from said second reflectivity portions of said optical medium, said first and second output powers of said front emission facet characterized by a fractional change;

(d) said rear emission facet having a first output power associated with said feedback from said first reflectivity portions of said optical medium, and a second output power associated with feedback from said second reflectivity portions of said optical medium, said first and second output powers of said rear emission facet being characterized by a fractional change;

(e) said fractional change associated with said first and second output powers of said front emission facet being less than said fractional change associated with said first and second output powers of said second emission facet.

32. The near-field optical system of claim 31, wherein said semiconductor laser has a first threshold current associated with said feedback from said first reflectivity portions of said medium, and a second threshold current associated with said feedback from said second reflectivity portions of said medium, said constant bias current of said semiconductor greater than said first threshold current and said second threshold current.

33. The near-field optical system of claim 32, wherein said first threshold current is substantially similar to said second threshold current.

34. A near-field optical method, comprising:

(a) providing a semiconductor laser having an output wavelength of $\lambda$ and having an emission facet with an aperture therein, said emission facet having a width w;

(b) writing on an optical medium, with said laser, while said laser is biased at a first bias current which is greater than a threshold current associated with optical feedback from said optical medium;

(c) reading said optical medium, with said laser, while said laser is biased at a second bias current which is greater than said threshold current associated with said optical feedback from said optical medium; and (d) detecting voltage fluctuation across said laser, during said reading.

35. The method of claim 34, further comprising positioning said emission facet of said laser at a distance d from said optical medium such that d<w/2.

36. The near-field optical apparatus of claim 35, wherein said emission facet is separated from said optical medium by a distance d such that d<w/2.

37. A near-field optical method, comprising:

(a) providing a semiconductor laser having a front emission facet;

(b) flying said semiconductor laser over an optical medium while operating said semiconductor laser at a constant bias current, said optical medium including regions of a first reflectivity and regions of a second reflectivity;

(c) outputting a first output power from said front emission facet, said first output power associated with feedback from said first reflectivity regions of said optical medium; and (d) outputting a second output power from said front emission facet, said second output power associated with feedback from said second reflectivity regions, said first output power of said front emission facet being substantially the same as said second output power of said front emission facet.

38. The method of claim 37, further comprising:

(a) outputting a first output power from a second emission facet of said semiconductor laser, said first output power associated with said feedback from said first reflectivity regions of said optical medium; and (b) outputting a second output power from said rear emission facet, said second output power associated with said feedback from said second reflectivity regions, said first output power of said rear emission facet being substantially the same as said second output power of said rear emission facet, an output wavelength of $\lambda$ and having a front emission facet with an aperture therein, said emission facet having a width w;

(c) writing on an optical medium, with said laser, while said laser is biased at a first bias current which is greater than a threshold current associated with optical feedback from said optical medium;

(d) reading said optical medium, with said laser, while said laser is biased at a second bias current which is greater than said threshold current associated with said optical feedback from said optical medium; and (e) detecting voltage fluctuation across said laser, during said reading.

* * * * *

UNITED STATES PATENT AND TRADEMARK OFFICE
CERTIFICATE OF CORRECTION

PATENT NO. : 6,574,257 B1
DATED : June 3, 2003
INVENTOR(S) : Thornton et al.

It is certified that error appears in the above-identified patent and that said Letters Patent is hereby corrected as shown below:

<u>Title page,</u>
Item [12], please delete "Thronton et al." and replace therefore with
-- Thornton et al. --
Item [75], Inventors, please delete "Robert L. Thronton," and replace therefore with
-- Robert L. Thornton, -- before "Los Altos, CA"

Signed and Sealed this

Fourth Day of November, 2003

JAMES E. ROGAN
*Director of the United States Patent and Trademark Office*